United States Patent
Ho et al.

(10) Patent No.: US 8,456,154 B2
(45) Date of Patent: Jun. 4, 2013

(54) LOW VOLTAGE DIFFERENTIAL SIGNALING TEST SYSTEM AND METHOD

(75) Inventors: Jui-Hsiung Ho, Taipei Hsien (TW); Wang-Ding Su, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 493 days.

(21) Appl. No.: 12/791,880

(22) Filed: Jun. 2, 2010

(65) Prior Publication Data
US 2011/0169480 A1 Jul. 14, 2011

(30) Foreign Application Priority Data
Jan. 12, 2010 (TW) .............................. 99100743 A

(51) Int. Cl.
- *G01R 13/20* (2006.01)
- *G01R 13/22* (2006.01)
- *G01R 13/34* (2006.01)
- *G01R 29/26* (2006.01)
- *G01R 25/00* (2006.01)

(52) U.S. Cl.
USPC ........... 324/121 R; 324/613; 324/614; 324/88

(58) Field of Classification Search
USPC ............. 702/64, 66, 108, 111, 119, 193, 195; 324/121 R
See application file for complete search history.

(56) References Cited

U.S. PATENT DOCUMENTS

| | | | |
|---|---|---|---|
| 6,281,699 B1 * | 8/2001 | Bishop | 324/750.01 |
| 6,675,117 B2 * | 1/2004 | Adam et al. | 702/106 |
| 7,443,201 B2 * | 10/2008 | Koo | 326/82 |
| 2007/0118311 A1 * | 5/2007 | Cheng | 702/64 |

* cited by examiner

*Primary Examiner* — Patrick Assouad
*Assistant Examiner* — Christopher McAndrew
(74) *Attorney, Agent, or Firm* — Altis Law Group, Inc.

(57) ABSTRACT

In a low voltage differential-mode signaling (LVDS) test system and method, a positive signal waveform and a negative signal waveform of an LVDS signal pair are obtained. A differential-mode high voltage, a differential-mode low voltage, and a common-mode noise are measured according to the positive signal waveform and the negative signal waveform. The measurement results are output to an output device.

18 Claims, 6 Drawing Sheets

LOW VOLTAGE DIFFERENTIAL SIGNALING TEST SYSTEM AND METHOD

BACKGROUND

1. Technical Field

Embodiments of the present disclosure relate to signal test systems and methods, and particularly to a low voltage differential signaling (LVDS) test system and method.

2. Description of Related Art

LVDS is an electrical signaling system that can transmit differential signals at high data transfer rates with low power consumption. Signal characteristics, such as differential-mode high voltage, differential-mode low voltage, and common-mode noise are required to be tested to ensure error free transmission in LVDS. Currently, LVDS tests are manually performed, which is inefficient and error prone.

DETAILED DESCRIPTION

In general, the word "module," as used herein, refers to logic embodied in hardware or firmware, or to a collection of software instructions, written in a program language. In one embodiment, the program language may be Java or C. One or more software instructions in the modules may be embedded in firmware, such as an EPROM. The modules described herein may be implemented as either software and/or hardware modules and may be stored in any type of computer-readable medium or other storage device.

Figure 1:
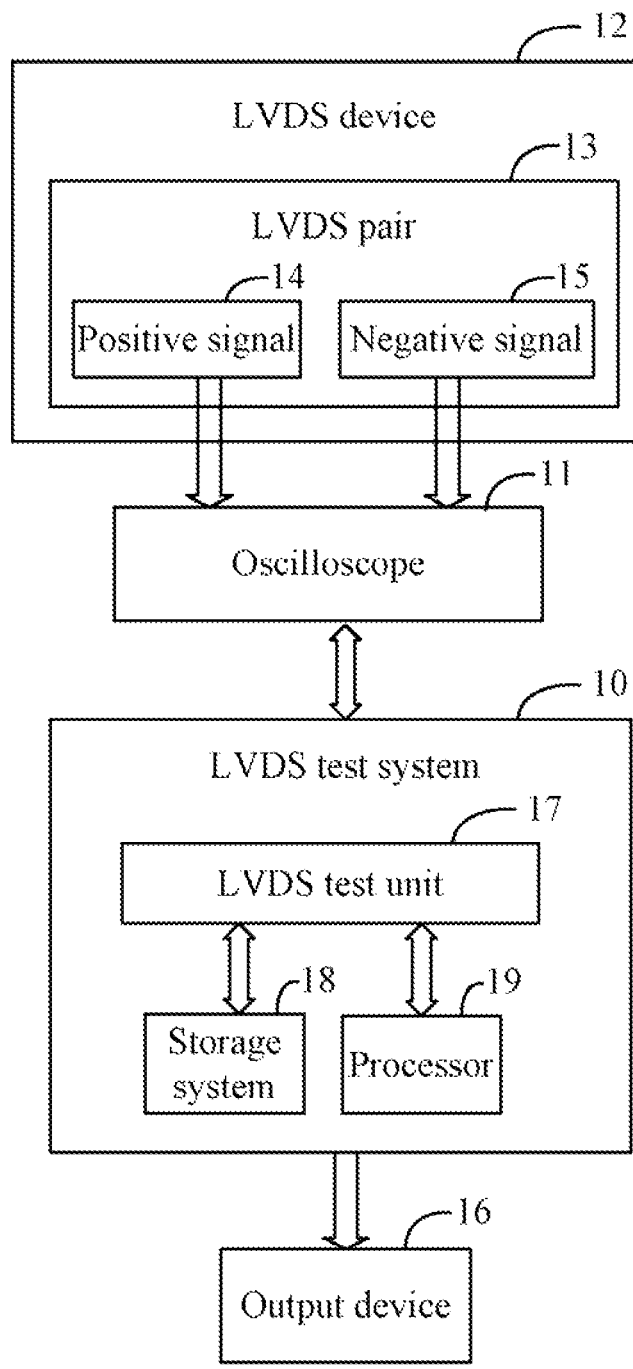
FIG. 1 is one embodiment of an application environment of a low voltage differential signaling (LVDS) test system.

FIG. 1 is a block diagram of one embodiment of an application environment of a low voltage differential signaling (LVDS) test system 10. The LVDS test system 10 may test signal characteristics, such as differential-mode high voltage, differential-mode low voltage, and common-mode noise of LVDS signal pairs. In one embodiment, the LVDS test system 10 is connected to an oscilloscope 11 and an LVDS device 12 in series. The LVDS test system 10 may be a data processing device or a computerized device such as a personal computer, an application server, or a workstation, for example. The LVDS device 12 may be an electronic device that generates one or more LVDS signal pairs, such as an LVDS signal pair 13 consisting of a positive signal 14 and a negative signal 15. Each LVDS signal pair is a pair of differential signals. The LVDS signal pairs may be transmitted from the LVDS device 12 to another LVDS device. The oscilloscope 11 may be a digital storage oscilloscope (DSO) that can capture signal waveforms of the LVDS signal pairs. The LVDS test system 10 may be further connected to an output device 16 such as a display screen or a printer, which outputs test results to users.

In one embodiment, the LVDS test system 10 may include an LVDS test unit 17, a storage system 18, and a processor 19. One or more computerized codes of the LVDS test unit 17 may be stored in the storage system 18 and executed by the processor 19. In one embodiment, the storage system 18 may be a memory, a hard disk, or a compact disk.

Figure 2:
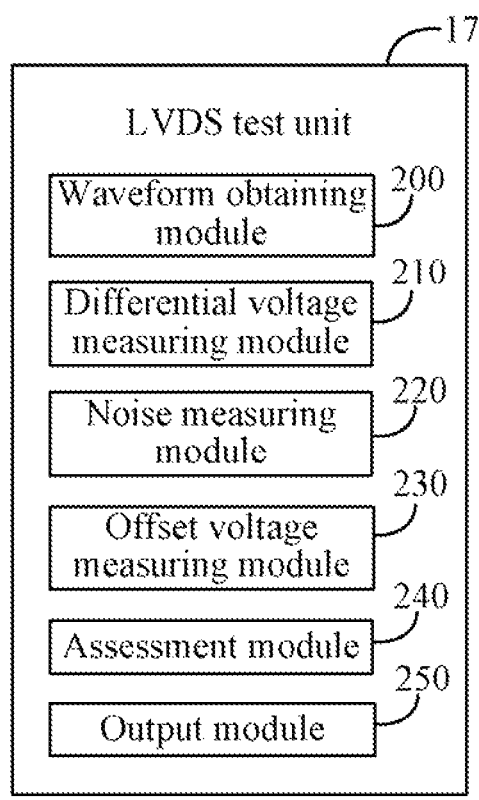
FIG. 2 is a block diagram of one embodiment of an LVDS test unit in FIG. 1.

FIG. 2 is a block diagram of one embodiment of the LVDS test unit 17 in FIG. 1. In one embodiment, the LVDS test unit 17 includes a waveform obtaining module 200, a differential-mode voltage measuring module 210, a noise measuring module 220, an offset voltage measuring module 230, an assessment module 240, and an output module 250.

Figure 4:
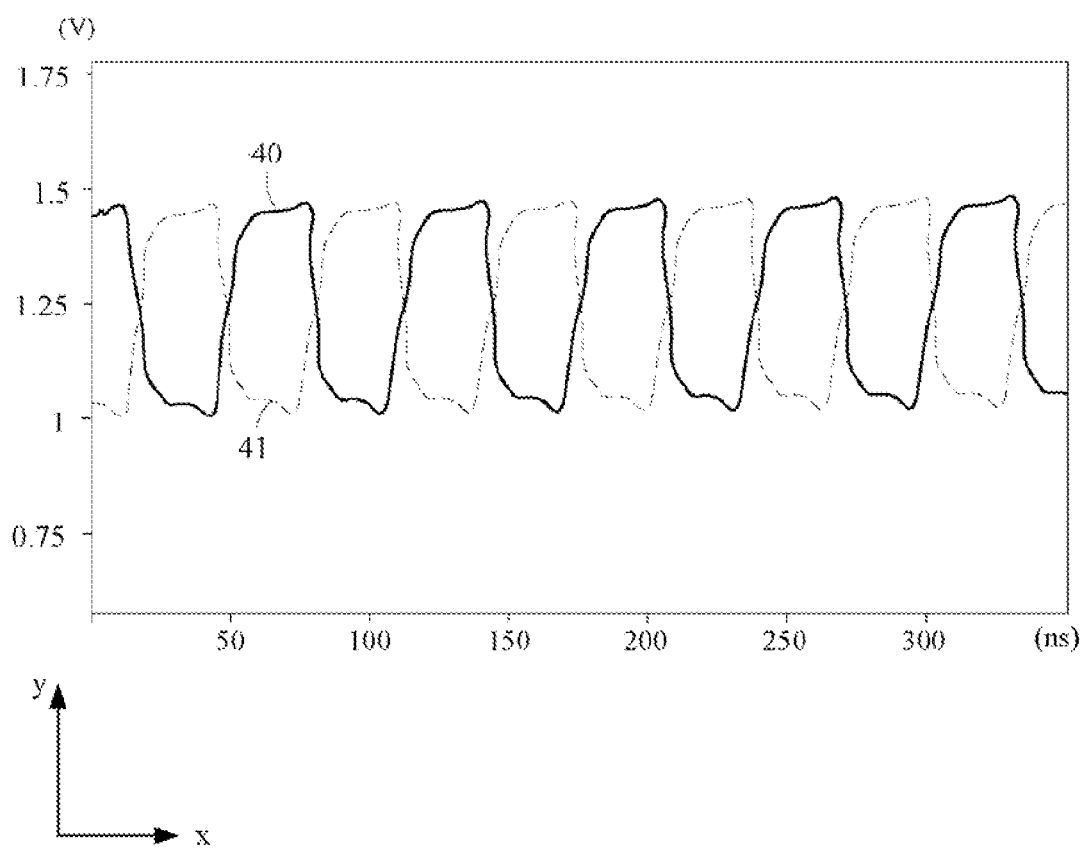
FIG. 4 illustrates one embodiment of a positive signal waveform and a negative signal waveform of an LVDS signal pair.

The waveform obtaining module 200 obtains a waveform of the positive signal 14 (hereinafter, "positive signal waveform") and a waveform of the negative signal 15 (hereinafter, "negative signal waveform"). It may be understood that a signal waveform is a graph of voltage plotted against time. In one embodiment, the waveform obtaining module 200 may control the oscilloscope 11 to obtain the positive signal waveform and the negative signal waveform of the LVDS signal pair 13. FIG. 4 illustrates one embodiment of a positive signal waveform 40 and a negative signal waveform 41 of the LVDS signal pair 13, where voltage is represented by the y-axis and time is represented by the x-axis of the waveforms 40, 41.

Figure 5:
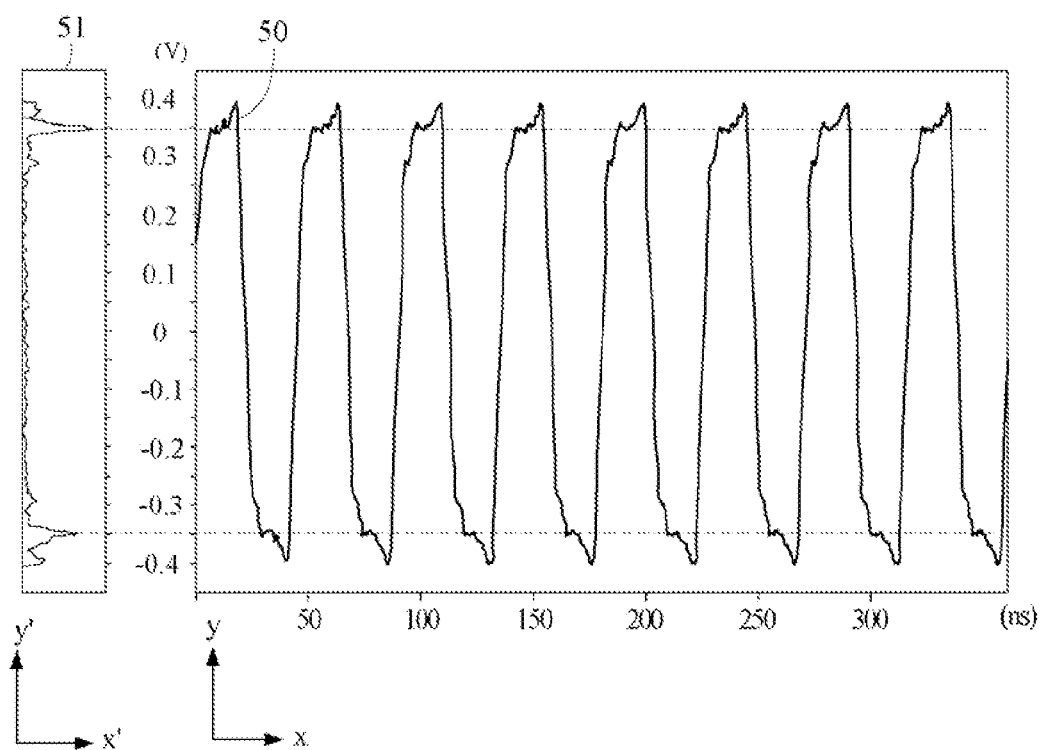
FIG. 5 illustrates one embodiment of a differential-mode signal waveform of an LVDS signal pair and a histogram of the differential-mode signal waveform.

The differential-mode voltage measuring module 210 measures a differential-mode high voltage and a differential-mode low voltage of the LVDS signal pair 13 according to the positive signal waveform and the negative signal waveform. In one embodiment, the differential-mode voltage measuring module 210 may subtract the negative signal waveform from the positive signal waveform to generate a differential-mode signal waveform of the LVDS signal pair 13. Accordingly, the differential-mode voltage measuring module 210 identifies a positive voltage with a highest frequency from all positive voltages of the differential-mode signal waveform as the differential-mode high voltage. The differential-mode voltage measuring module 210 further identifies a negative voltage with a high frequency from negative voltages of the differential-mode signal waveform as the differential-mode low voltage. For example, if a frequency for 0.35V is the highest frequency for positive voltages, the differential-mode high voltage is 0.35V. If a frequency for −0.35V is the highest frequency for negative voltages, the differential-mode low voltage is −0.35V. FIG. 5 illustrates one embodiment of a differential-mode signal waveform 50 and a histogram 51 of the differential-mode signal waveform 50. The histogram 51 shows a frequency distribution of voltages in the differential-mode signal waveform 50, where voltage is represented by the y'-axis and frequency is represented by the x'-axis of the histogram 51.

Figure 6:
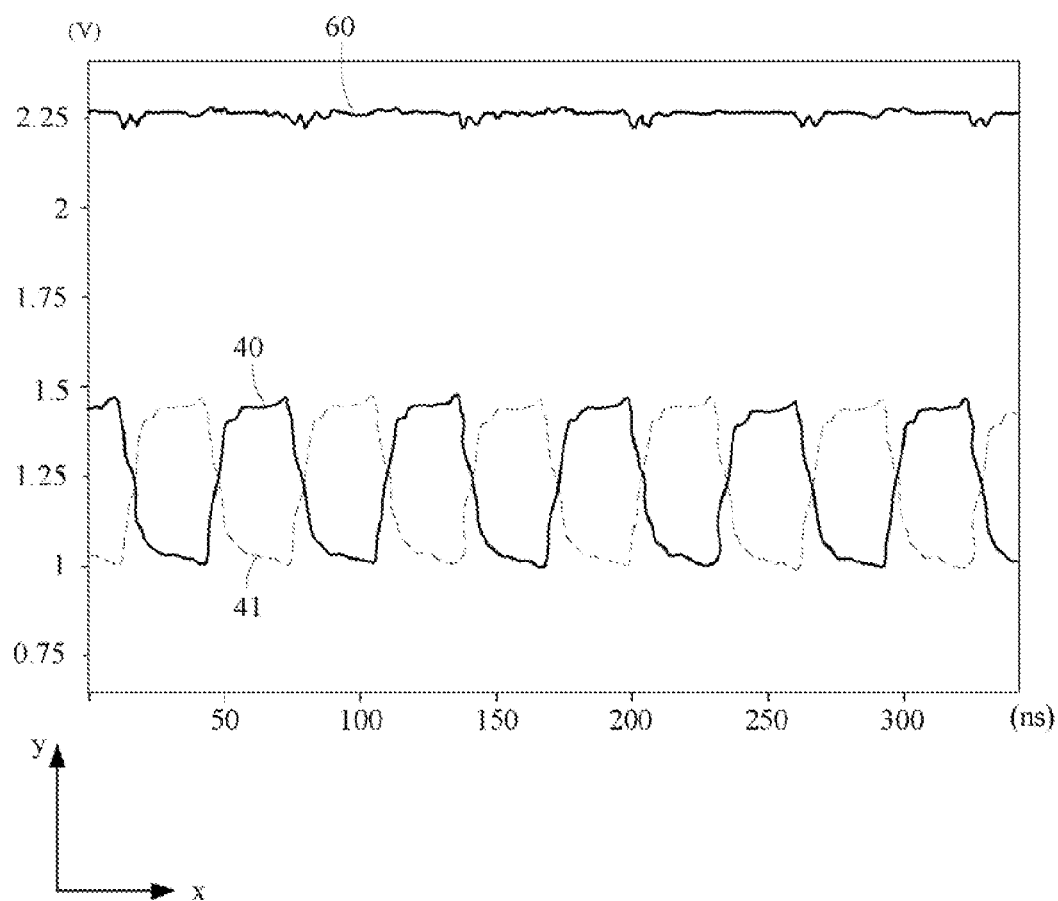
FIG. 6 illustrates an exemplary common-mode signal waveform of an LVDS signal pair.

The noise measuring module 220 measures a common-mode noise of the LVDS signal pair 13 according to the positive signal waveform and the negative signal waveform. In one embodiment, the noise measuring module 220 adds the positive signal waveform to the negative signal waveform to generate a common-mode signal waveform. The noise measuring module 220 identifies a highest voltage and a lowest voltage of the common-mode signal waveform, and calculates a difference between the highest voltage and the lowest voltage as the common-mode noise of the LVDS signal pair 13. FIG. 6 illustrates an exemplary common-mode signal waveform 60 of the LVDS signal pair 13. The common-mode signal waveform 60 is generated by adding the positive signal waveform 40 to the negative signal waveform 41.

The offset voltage measuring module 230 measures an offset voltage of the LVDS signal pair 13 according to the positive signal waveform and the negative signal waveform.

In one embodiment, the offset voltage measuring module 230 may calculate a mean value of voltage of the common-mode signal waveform derived from the positive signal waveform and the negative signal waveform, and halve the mean value of voltage to obtain the offset voltage of the LVDS signal pair 13.

The assessment module 240 assesses whether the differential-mode high voltage, the differential-mode low voltage, the common-mode noise, and the offset voltage of the LVDS signal pair 13 comply with relevant LVDS specifications. In one example, the LVDS specifications define a voltage range, such as a range from 0.25V to 0.45V for differential-mode high voltage reference. If the differential-mode high voltage falls into the voltage range, the assessment module 240 may assess that the differential-mode high voltage complies with the LVDS specifications.

The output module 250 outputs the differential-mode high voltage, the differential-mode low voltage, the common-mode noise, and the offset voltage of the LVDS signal pair 13 to the output device 16. The output module 250 may further output the assessment results of the high voltage, the low voltage, the common-mode noise and the offset voltage of the LVDS signal pair 13.

Figure 3:
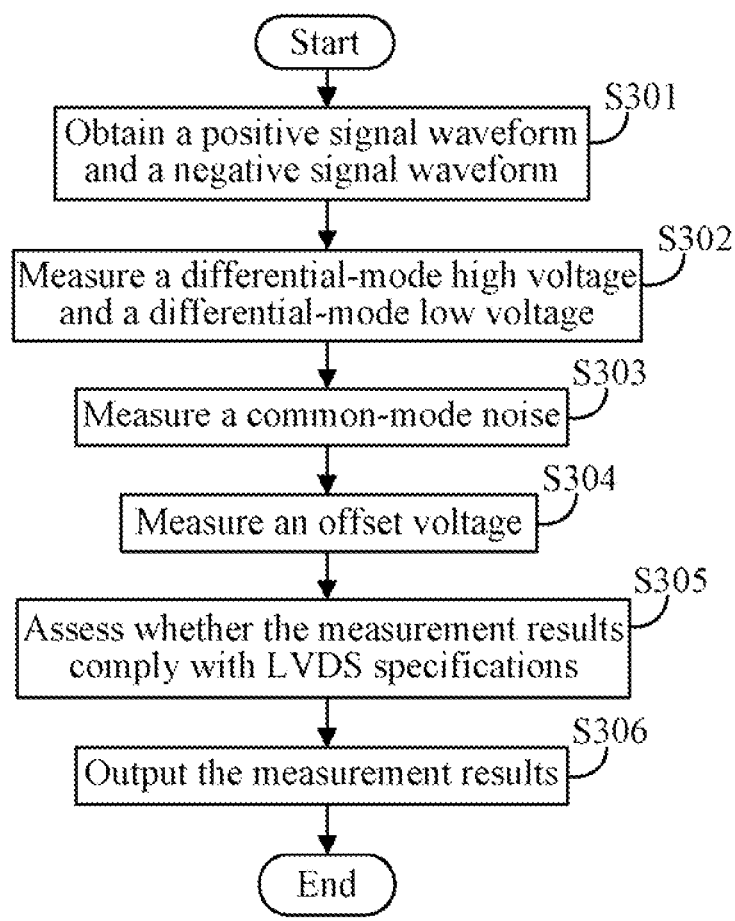
FIG. 3 is a flowchart of one embodiment of an LVDS test method implementing a test system, such as that in FIG. 1.

FIG. 3 is a flowchart of one embodiment of an LVDS test method implementing a test system, such as that in FIG. 1. The test method may test signal characteristics, such as differential-mode high voltage, differential-mode low voltage, and common-mode noise of the LVDS signal pair 13 generated by the LVDS device 12. Depending on the embodiments, additional blocks may be added, others removed, and the ordering of the blocks may be changed.

In block S301, the waveform obtaining module 200 obtains a positive signal waveform and a negative signal waveform of the LVDS signal pair 13. As mentioned above, the positive signal waveform corresponds to the positive signal 14 of the LVDS signal pair 13, and the negative signal waveform corresponds to the negative signal 15 of the LVDS signal pair 13. In one embodiment, the waveform obtaining module 200 controls the oscilloscope 11 to obtain the positive signal waveform and the negative signal waveform. The waveform obtaining module 200 may send a waveform capture command to the oscilloscope 11. In response to the waveform capture command, the oscilloscope 11 captures the positive signal waveform and the negative signal waveform from the LVDS device 12, and sends the positive signal waveform and the negative signal waveform to the waveform obtaining module 200. FIG. 4 illustrates one embodiment of a positive signal waveform 40 and a negative signal waveform 41 of the LVDS signal pair 13.

In block S302, the differential-mode voltage measuring module 210 measures a differential-mode high voltage and a differential-mode low voltage of the LVDS signal pair 13 according to the positive signal waveform and the negative signal waveform. In one embodiment, the differential-mode voltage measuring module 210 may subtract the negative signal waveform from the positive signal waveform to generate a differential-mode signal waveform of the LVDS signal pair 13. The differential-mode voltage measuring module 210 may calculate a frequency distribution of voltages in the differential-mode signal waveform. Accordingly, the differential-mode voltage measuring module 210 identifies a positive voltage with a high frequency as the differential-mode high voltage and identifies a negative voltage with a high frequency as the differential-mode low voltage. FIG. 5 illustrates one embodiment of a differential-mode signal waveform 50 and a histogram 51 of the differential-mode signal waveform 50. The histogram 51 shows two peak frequencies of the differential-mode signal waveform 50. One peak frequency corresponds to a positive voltage of 0.35V. The other frequency peak corresponds to a negative voltage of −0.35V. Accordingly, the differential-mode high voltage is determined as being 0.35V and the differential-mode low voltage is determined as being −0.35V.

In one embodiment, the differential-mode voltage measuring module 210 may further measure a positive peak voltage and a negative peak voltage of the differential-mode signal waveform. The positive peak voltage is a positive voltage of greatest magnitude of the differential-mode signal waveform, and the negative peak voltage is a negative voltage of greatest magnitude of the differential-mode signal waveform. In one example with respect to FIG. 5, the positive peak voltage is 0.39V, and the negative peak voltage is −0.39V.

In block S303, the noise measuring module 220 measures a common-mode noise of the LVDS signal pair 13 according to the positive signal waveform and the negative signal waveform. In one embodiment, the noise measuring module 220 adds the positive signal waveform to the negative signal waveform to generate a common-mode signal waveform. The noise measuring module 220 identifies a highest voltage and a lowest voltage of the common-mode signal waveform, and calculates a difference between the highest voltage and the lowest voltage as the common-mode noise of the LVDS signal pair 13. FIG. 6 illustrates an exemplary common-mode signal waveform 60, which is derived from the positive signal waveform 40 and the negative signal waveform 41. In the exemplary common-mode signal waveform 60, the highest voltage is 2.35V and the lowest voltage is 2.20V. Accordingly, the common-mode noise of the LVDS signal pair 13 is 0.15V.

In block S304, the offset voltage measuring module 230 measures an offset voltage of the LVDS signal pair 13 according to the positive signal waveform and the negative signal waveform. The offset voltage measuring module 230 may measure the offset voltage of the LVDS signal pair 13 according to the common-mode signal waveform described in block S303. In one embodiment, the offset voltage measuring module 230 may calculate a mean value of voltage of the common-mode signal waveform, and halve the mean value of voltage to obtain the offset voltage of the LVDS signal pair 13. For example, if a mean value of voltage of the common-mode signal waveform is 2.3V, the offset voltage of the LVDS signal pair 13 is 1.15V.

In block S305, the assessment module 240 assesses whether the differential-mode high voltage, the differential-mode low voltage, the common-mode noise, and the offset voltage of the LVDS signal pair 13 comply with relevant LVDS specifications. In one example, a differential-mode high voltage specification defines a voltage range, such as a range from 0.25V to 0.45V. If the differential-mode high voltage falls into the voltage range, the assessment module 240 may assess that the differential-mode high voltage complies with the differential-mode high voltage specification. For example, if the differential-mode high voltage is 0.35V and the differential-mode high voltage specification is defined as 0.25V to 0.45V, the differential-mode high voltage is assessed to be in compliance with the differential-mode high voltage specification. The relevant LVDS specifications may change depending on the embodiment. For example, LVDS specifications may define a relationship between the differential-mode high voltage and the differential-mode low voltage.

In block S306, the output module 250 outputs the differential-mode high voltage, the differential-mode low voltage, the common-mode noise, and the offset voltage of the LVDS signal pair 13 to the output device 16. In one example, the output device 16 is a display screen. Accordingly, the output module 250 displays the differential-mode high voltage, the differential-mode low voltage, the common-mode noise, and the offset voltage on the display screen. The output module 250 may further output the assessment results of the differential-mode high voltage, the differential-mode low voltage, the common-mode noise and the offset voltage of the LVDS signal pair 13 with the LVDS specifications.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A low voltage differential signaling (LVDS) test system, the test system comprising:
   a storage system;
   at least one processor;
   an LVDS test unit being stored in the storage system and executable by the at least one processor, the LVDS test unit comprising:
   a waveform obtaining module operable to obtain a positive signal waveform and a negative signal waveform of an LVDS signal pair generated by an LVDS device;
   a differential-mode voltage measuring module operable to generate a differential-mode signal waveform of the LVDS signal pair according to the positive signal waveform and the negative signal waveform, and measure a differential-mode high voltage and a differential-mode low voltage of the LVDS signal pair according to the differential-mode signal waveform;
   a noise measuring module operable to generate a common-mode signal waveform of the LVDS signal pair according to the positive signal waveform and the negative signal waveform, and measure a common-mode noise of the LVDS signal pair according to the common-mode signal waveform; and
   an output module operable to output the differential-mode high voltage, the differential-mode low voltage, and the common-mode noise to an output device.

2. The test system of claim 1, wherein the LVDS test unit further comprises an offset voltage measuring module operable to measure an offset voltage of the LVDS signal pair according to the positive signal waveform and the negative signal waveform.

3. The test system of claim 1, wherein the LVDS test unit further comprises an assessment module operable to assess if the differential-mode high voltage, the differential-mode low voltage, and the common-mode noise comply with LVDS specifications.

4. The test system of claim 1, wherein the waveform obtaining module controls an oscilloscope to obtain the positive signal waveform and the negative signal waveform.

5. The test system of claim 1, wherein the differential-mode voltage measuring module measures the differential-mode high voltage and the differential-mode low voltage by calculating a frequency distribution of voltages in the differential-mode signal waveform.

6. The test system of claim 1, wherein the differential-mode voltage measuring module is further operable to measure a positive peak voltage and a negative peak voltage of the differential-mode signal waveform.

7. A low voltage differential signaling (LVDS) test method, comprising:
   obtaining a positive signal waveform and a negative signal waveform of an LVDS signal pair generated by an LVDS device;
   generating a differential-mode signal waveform of the LVDS signal pair according to the positive signal waveform and the negative signal waveform, and measuring a differential-mode high voltage and a differential-mode low voltage of the LVDS signal pair according to the differential-mode signal waveform;
   generating a common-mode signal waveform of the LVDS signal pair according to the positive signal waveform and the negative signal waveform, and measuring a common-mode noise of the LVDS signal pair according to the common-mode signal waveform; and
   outputting the differential-mode high voltage, the differential-mode low voltage, and the common-mode noise to an output device.

8. The method of claim 7, further comprising:
   measuring an offset voltage of the LVDS signal pair according to the positive signal waveform and the negative signal waveform.

9. The method of claim 7, further comprising:
   assessing if the differential-mode high voltage, the differential-mode low voltage, and the common-mode noise comply with LVDS specifications.

10. The method of claim 7, wherein the positive signal waveform and the negative signal waveform are obtained by an oscilloscope.

11. The method of claim 7, wherein the differential-mode high voltage and the differential-mode low voltage are measured by calculating a frequency distribution of voltages in the differential-mode signal waveform.

12. The method of claim 7, further comprising:
   measuring a positive peak voltage and a negative peak voltage of the differential-mode signal waveform.

13. A non-transitory computer-readable medium having stored thereon instructions that, when executed by a processor of a computerized device, cause the computerized device to execute a low voltage differential signaling (LVDS) test method, the method comprising:
   obtaining a positive signal waveform and a negative signal waveform of an LVDS signal pair generated by an LVDS device;
   generating a differential-mode signal waveform of the LVDS signal pair according to the positive signal waveform and the negative signal waveform, and measuring a differential-mode high voltage and a differential-mode low voltage of the LVDS signal pair according to the differential-mode signal waveform;
   generating a common-mode signal waveform of the LVDS signal pair according to the positive signal waveform and the negative signal waveform, and measuring a common-mode noise of the LVDS signal pair according to the common-mode signal waveform; and
   outputting the differential-mode high voltage, the differential-mode low voltage, and the common-mode noise to an output device.

14. The non-transitory computer-readable medium of claim 13, wherein the method further comprises:
   measuring an offset voltage of the LVDS signal pair according to the positive signal waveform and the negative signal waveform.

15. The non-transitory computer-readable medium of claim 13, wherein the method further comprises:
   assessing if the differential-mode high voltage, the differential-mode low voltage, and the common-mode noise comply with LVDS specifications.

16. The non-transitory computer-readable medium of claim 13, wherein the positive signal waveform and the negative signal waveform are obtained by an oscilloscope.

17. The non-transitory computer-readable medium of claim 13, wherein the differential-mode high voltage and the differential-mode low voltage are measured by calculating a frequency distribution of voltages in the differential-mode signal waveform.

18. The non-transitory computer-readable medium of claim 13, wherein the method further comprises:
   measuring a positive peak voltage and a negative peak voltage of the differential-mode signal waveform.

* * * * *